US012622250B2

(12) United States Patent
Amin et al.

(10) Patent No.: US 12,622,250 B2
(45) Date of Patent: May 5, 2026

(54) VIAS WITH VERTICALLY NON-UNIFORM OR DISCONTINUOUS STACK

(71) Applicant: Intel Corporation, Santa Clara, CA (US)

(72) Inventors: Payam Amin, Portland, OR (US); Tofizur Rahman, Portland, OR (US); Bozidar Marinkovic, Portland, OR (US); Santhosh Kumar Koduri, Portland, OR (US); Tugba Koker Aykol, Beaverton, OR (US); Jayeeta Sen, Beaverton, OR (US); David Bennett, Portland, OR (US); Conor P. Puls, Portland, OR (US); Clay Mortensen, Portland, OR (US); Leslie L. Chan, Portland, OR (US); Hoang Doan, Beaverton, OR (US); Dolly Natalia Ruiz Amador, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 272 days.

(21) Appl. No.: 17/711,008

(22) Filed: Mar. 31, 2022

(65) Prior Publication Data

US 2023/0317563 A1     Oct. 5, 2023

(51) Int. Cl.
| | |
|---|---|
| *H01L 23/48* | (2006.01) |
| *H01L 21/768* | (2006.01) |
| *H01L 23/528* | (2006.01) |
| *H01L 23/532* | (2006.01) |
| *H01L 29/06* | (2006.01) |

| | |
|---|---|
| *H01L 29/423* | (2006.01) |
| *H01L 29/775* | (2006.01) |
| (Continued) | |

(52) U.S. Cl.
CPC ...... *H01L 23/481* (2013.01); *H01L 21/76898* (2013.01); *H01L 23/5283* (2013.01); *H01L 23/53257* (2013.01); *H10D 30/43* (2025.01); *H10D 30/6735* (2025.01); *H10D 30/6757* (2025.01); *H10D 62/121* (2025.01)

(58) Field of Classification Search
CPC ............. H01L 23/481; H01L 21/76898; H01L 23/5283; H01L 23/53257; H10D 30/43; H10D 30/6735; H10D 30/6757; H10D 62/121; H10D 30/014; H10D 30/6729; H10D 62/364; H10D 64/01; H10D 64/254; B82Y 10/00
USPC ........................................ 257/343
See application file for complete search history.

(56) References Cited

U.S. PATENT DOCUMENTS

| | | | |
|---|---|---|---|
| 2019/0067091 A1* | 2/2019 | Morrow ............... | H10D 30/024 |
| 2021/0134802 A1* | 5/2021 | Gomes .................. | H10B 12/36 |
| (Continued) | | | |

*Primary Examiner* — Tong-Ho Kim
(74) *Attorney, Agent, or Firm* — Schwabe, Williamson & Wyatt, P.C.

(57) ABSTRACT

Embodiments disclosed herein include a via structure and methods of forming the via structure. In an embodiment, the via structure comprises a substrate and an opening through the substrate. In an embodiment, the opening has a first portion and a second portion under the first portion. In an embodiment, the via structure further comprises a lining on sidewalls of the first portion of the opening, and a via filling the opening. In an embodiment, the via has a first region with a first width and a second region with a second width, wherein the first width is smaller than the second width.

23 Claims, 10 Drawing Sheets

(51) Int. Cl.
| | |
|---|---|
| *H01L 29/786* | (2006.01) |
| *H10D 30/43* | (2025.01) |
| *H10D 30/67* | (2025.01) |
| *H10D 62/10* | (2025.01) |

(56) References Cited

U.S. PATENT DOCUMENTS

| | | | |
|---|---|---|---|
| 2021/0391320 A1* | 12/2021 | Wang | H10D 30/6735 |
| 2021/0391325 A1* | 12/2021 | Su | H10D 30/6735 |
| 2021/0399099 A1* | 12/2021 | Chu | H01L 21/76831 |
| 2022/0069117 A1* | 3/2022 | Yu | H10D 30/024 |

* cited by examiner

VIAS WITH VERTICALLY NON-UNIFORM OR DISCONTINUOUS STACK

TECHNICAL FIELD

Embodiments of the disclosure are in the field of semiconductor structures and processing and, in particular, to backside contact architectures for non-planar transistor structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
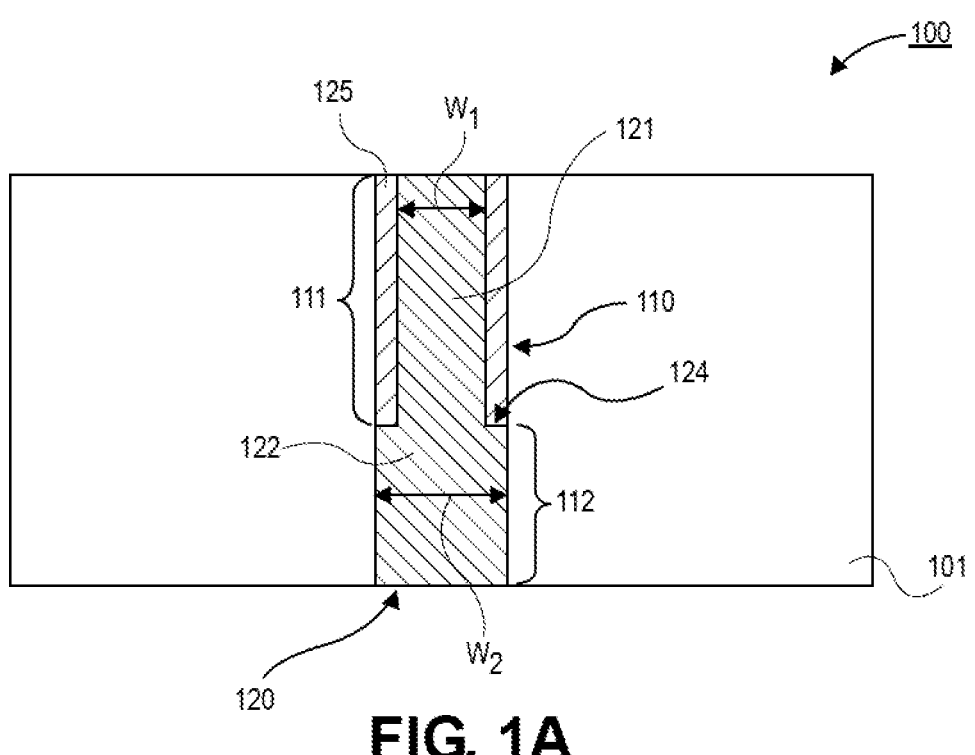
FIG. 1A is a cross-sectional illustration of a backside via with a first region with a first width and a second region with a second width, in accordance with an embodiment.

Embodiments described herein comprise backside contact architectures for non-planar transistor structures. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

To provide context, certain transistor device architectures include backside vias. The backside vias are conductive vias that pass through the substrate (e.g., a semiconductor substrate) underlying the transistor device. That is, the contact to a source region or a drain region is made from what is considered the backside of the device. In certain architectures there needs to be a liner around the backside via in order to prevent shorting to other features in the device. However, the liner occupies space in the via opening and reduces the cross-sectional area of the conductive via. This results in an increase in the resistance of the backside via and negatively impacts device performance. Additionally, it is to be appreciated that only a certain portion of the conductive via needs to be isolated by a liner. For example, only the top region of the conductive via may need to be electrically isolated. As such, the bottom portion of the liner is unnecessary in some architectures.

Accordingly, embodiments disclosed herein include semiconductor devices with backside vias that have a non-uniform metal width. An insulative liner may be provided at the top of the backside via, and the bottom of the backside via may be in direct contact with the substrate. That is, the liner may be absent from the bottom of the backside via. This allows for the width of the backside via to be increased. A wider metal width in the backside via improves vertical resistivity as well as the contact resistance of the backside power delivery vias. This improves the performance of the semiconductor device. The wider width also improves metal fill quality, which increases reliability of the backside power delivery vias.

In certain embodiments, backside vias with non-uniform widths may be integrated with a non-planar transistor device. For example, the backside vias may be coupled to a source region and/or drain region of a tri-gate transistor device or a gate-all-around (GAA) transistor device. While examples of non-planar transistor devices are described herein, it is to be appreciated that embodiments may also be used in planar transistor architectures.

Referring now to FIG. 1A, a cross-sectional illustration of a semiconductor device 100 is shown, in accordance with an embodiment. In an embodiment, the semiconductor device 100 may include a substrate 101. The substrate 101 may be a semiconductor substrate. The semiconductor substrate 101 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or Group III-V materials. The semiconductor substrate 101, depending on the stage of manufacture, often includes transistors, integrated circuitry, and the like. The substrate may also include semiconductor materials, metals, dielectrics, dopants, and other materials commonly found in semiconductor substrates.

In an embodiment, a transistor device (not shown) may be provided over the top surface of the substrate 101. In a particular embodiment, the transistor device may be a non-planar transistor device, such as a tri-gate transistor or a GAA transistor. In other embodiments, a planar transistor may be provided over the substrate 101. In an embodiment, the backside via 120 in the substrate 101 may be coupled to a source region and/or a drain region of the transistor device.

In an embodiment, an opening 110 may be formed through the substrate 101. In the illustrated embodiment, the opening 110 extends substantially through an entire thickness of the substrate 101. In other embodiments, the opening 110 may pass partially through a thickness of the substrate 101. The opening 110 may have a substantially uniform width through the thickness of the substrate 101. As used herein, "substantially uniform" may refer to a range of values that are within ten percent of each other. For example, an opening 110 that has a width at a first location that is measured as being 20 nm may have a width that is substantially uniform if the width at any location along the opening is between 18 nm and 22 nm. However, in other embodiments, the opening 110 may not have a width that is substantially uniform. For example, the opening 110 may have a wide end and a narrow end with a relatively consistent taper from the wide end to the narrow end. While several opening 110 architectures are explicitly described, it is to be appreciated that any opening architecture may be used in accordance with various embodiments described herein.

In an embodiment, the opening 110 may have a first portion 111 and a second portion 112. The first portion 111 may be provided above the second portion 112. In embodiments with a substantially uniform opening 110 width, there may not be a discernable junction that visibly defines the first portion 111 from the second portion 112. However, the materials within the opening 110 may be used to define the first portion 110 and the second portion 112. For example, a liner 125 may be provided in the first portion 111 of the opening, and the second portion 112 of the opening 110 may not have a liner 125. In the illustrated embodiment, the first portion 111 is shown as being longer than the second portion 112. In other embodiments, the first portion 111 may be substantially the same length as the second portion 112, or the second portion 112 may be longer than the first portion 111.

As noted above, a liner 125 is formed along the sidewalls of the first portion 111 of the opening 110. The liner 125 may be used to electrically isolate a region of the via 120. For example, the liner 125 may electrically isolate a first region 121 of the via 120. The liner 125 may comprise oxygen and/or nitrogen. For example, the liner 125 may comprise a silicon and oxygen (e.g., $SiO_X$), or the liner 125 may comprise silicon and nitrogen (e.g., $SiN_X$). Though, it is to be appreciated that other insulating materials may also be used in some embodiments. Additionally, while a single liner 125 is shown, embodiments may include multiple liners with each liner having a different material composition. In an embodiment, the liner 125 may have a thickness that is less than the width of the opening 110. In an embodiment, the liner 125 may have a thickness that is approximately 5 nm or less or approximately 1 nm or less. As used herein, "approximately" may refer to a range that is within ten percent of the stated value. For example, approximately 1 nm may refer to a range between 0.9 nm and 1.1 nm.

In an embodiment, the backside via 120 may comprise a first region 121 and a second region 122. The first region 121 may be provided in the first portion 111 of the opening 110, and the second region 122 may be provided in the second portion 112 of the opening 110. Due to the presence of the liner 125, the first region 121 may have a first width $W_1$ that is smaller than a second width $W_2$ of the second region 122. In an embodiment, the first width $W_1$ may be approximately ninety percent of the second width $W_2$ or less. The second width $W_2$ may be any suitable width for proper integration with transistor devices. For example, the second width $W_2$ may be approximately 20 nm or less, approximately 10 nm, or approximately 5 nm or less. As noted above, the ability to have a larger second width $W_2$ improves the vertical resistivity as well as the contact resistance of the backside vias 120, which improves performance of the device. The wider width also improves metal fill quality, which increases reliability of the backside vias 120. In an embodiment, the second region 122 of the backside via 120 may be in direct contact with the substrate 101. That is, there may not be any liner or barrier between the backside via 120 and the substrate 101.

In a particular embodiment, the junction 124 between the first region 121 and the second region 122 may have any interface. In the illustrated embodiment, the junction 124 is shown as having a distinct step. That is, a top surface of the second region 122 may be exposed. The top surface of the second region 122 may be substantially parallel to a top or bottom surface of the backside via 120. In an embodiment, the top surface of the second region 122 may be directly contacted by the overlying liner 125. The width of the exposed top surface of the second region 122 may be substantially equal to a width of the liner 125.

In an embodiment, a width of the first region 121 of the backside via 120 may be substantially uniform. That is, the sidewalls of the first region 121 may be substantially vertical in some embodiments. Similarly, a width of the second region 122 of the backside via 120 may be substantially uniform. That is, the sidewalls of the second region 122 may be substantially vertical in some embodiments. While shown as being vertical in FIG. 1A, it is to be appreciated that sidewalls of the first region 121 and the second region 122 may not be vertical in all embodiments described herein.

In an embodiment, the backside via 120 may comprise a metal material. As used herein, the term metal includes alloys, stacks, and other combinations of multiple metals. For example, the metal backside via 120 may include barrier layers (e.g., layers including one or more of Ta, TaN, Ti or TiN), stacks of different metals or alloys, etc. Thus, the backside via 120 may be a single material layer, or may be formed from several layers, including conductive liner layers and fill layers. Any suitable deposition process, such as chemical vapor deposition or physical vapor deposition, may be used to form backside via 120. In an embodiment, the backside via 120 may be composed of a conductive material such as, but not limited to, Cu, Al, Ti, Zr, Hf, V, Ru, Co, Ni, Pd, Pt, W, Ag, Au or alloys thereof.

Figure 1B:
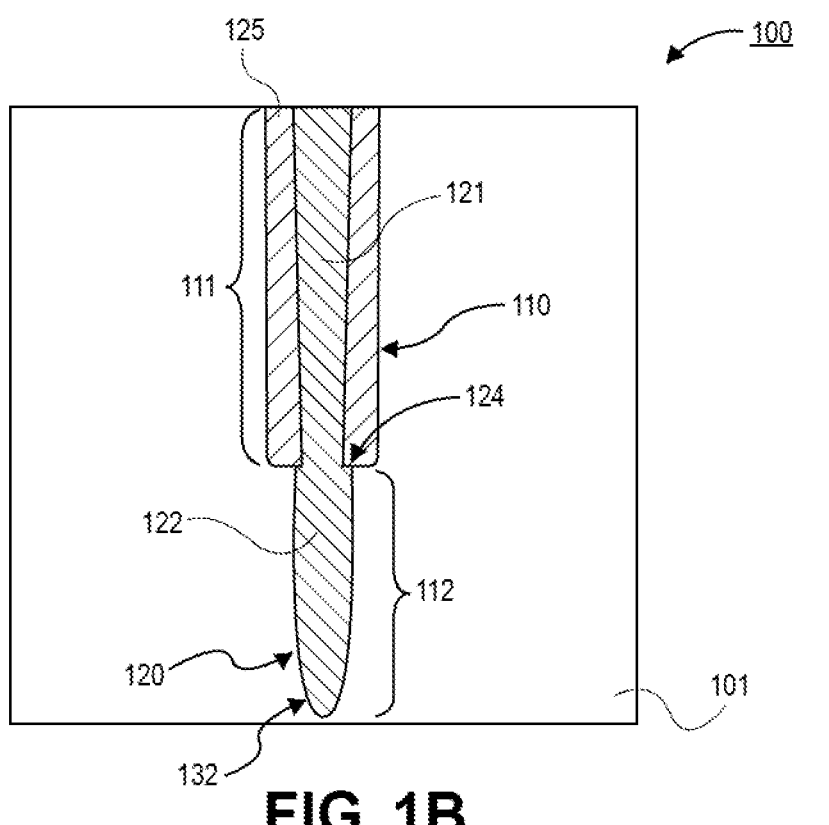
FIG. 1B is a cross-sectional illustration of a backside via with a first region with a first width and a second region with a second width and a rounded bottom surface, in accordance with an embodiment.

Referring now to FIG. 1B, a cross-sectional illustration of a semiconductor device 100 is shown, in accordance with an additional embodiment. In an embodiment, the semiconductor device 100 may include a substrate 101. For example, the substrate 101 may be a semiconductor substrate, such as silicon or the like. In an embodiment, an opening 110 may be formed into the substrate 101. Unlike the opening 110 described with respect to FIG. 1A, the opening 110 may have a non-uniform width through the depth of the opening 110. For example, the first portion 111 of the opening 110 may be wider than a bottom second portion 112 of the opening 110. The first portion 111 may accommodate both a liner 125 and a first region 121 of the backside via 120. The second portion 112 of the opening 110 may accommodate the second region 122 of the backside via 120. As shown in FIG. 1B, the opening 110 may not pass entirely through a thickness of the substrate 101 in some embodiments.

In an embodiment, the first region 121 of the backside via 120 may have a non-uniform thickness. For example, the top of the first region 121 may be wider than a bottom of the first region 121. That is, in some embodiments, sidewalls of the first region 121 may have a relatively constant taper in order to reduce the width of the first region 121. Similarly, the width of the second region 122 may also be non-uniform in some embodiments. Particularly, the bottom surface 132 of the second region 122 may be rounded. For example, the second region 122 may have an elliptical bottom surface 132.

Despite the varying widths of the first region 121 and the second region 122 of the backside via 120, the junction 124 between the two regions 121 and 122 may still have a stepped profile. The stepped profile may result in a portion of the top surface of the second region 122 being exposed outside of the width of the first region 121. In an embodiment, the exposed top surface of the second region 122 may be covered and directly contacted by the liner 125. In the illustrated embodiment, the width of the liner 125 is wider than the width of the exposed top surface of the second region 122. Though, in other embodiments, the width of the exposed top surface of the second region 122 may be substantially equal to a width of the liner 125.

Referring now to FIGS. 2A-2D, a series of zoomed in cross-sectional illustrations of the interface between the first region 221 and the second region 222 is shown, in accordance with various embodiments.

Figures 2A, 2B, 2C, 2D:
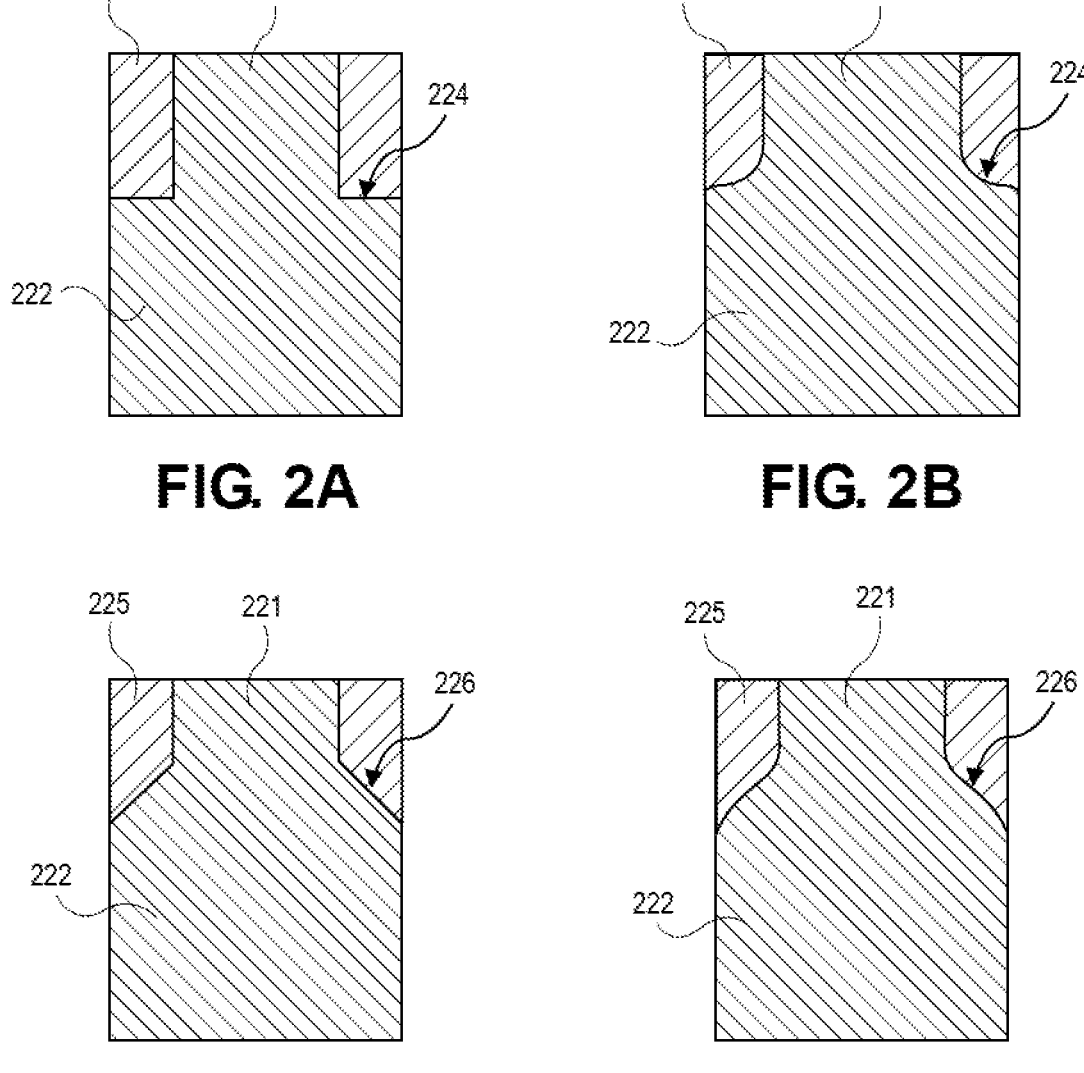
FIG. 2A is a zoomed in cross-sectional illustration highlighting a square stepped interface between the first region of the backside via and the second region of the backside via, in accordance with an embodiment.
FIG. 2B is a zoomed in cross-sectional illustration highlighting a rounded stepped interface between the first region of the backside via and the second region of the backside via, in accordance with an embodiment.
FIG. 2C is a zoomed in cross-sectional illustration highlighting a tapered interface between the first region of the backside via and the second region of the backside via, in accordance with an embodiment.
FIG. 2D is a zoomed in cross-sectional illustration highlighting a rounded tapered interface between the first region of the backside via and the second region of the backside via, in accordance with an embodiment.

Referring now to FIG. 2A, a cross-sectional illustration of a backside via with a stepped interface 224 is shown, in accordance with an embodiment. As shown, the top surface of the second region 222 is a substantially flat surface. The top surface of the second region 222 and the sidewall of the first region 221 may substantially form a right angle. Additionally, the liner 225 may directly contact the top surface of the second region 222.

Referring now to FIG. 2B, a cross-sectional illustration of a backside via with a stepped interface 224 is shown, in accordance with an additional embodiment. The embodiment shown in FIG. 2B may be substantially similar to the embodiment shown in FIG. 2A, with the exception of the interface 224. Instead of being angular, the interface 224 has rounded corners. The liner 225 may conform to the curved interface 224.

Referring now to FIG. 2C, a cross-sectional illustration of a backside via with a sloped interface 226 is shown, in accordance with an embodiment. As shown, an interface 226 includes a sloped (or tapered) top surface of the second region 222. That is, there may not be a distinct step between the first region 221 and the second region 222 in some embodiments. The liner 225 may conform to the sloped interface 226.

Referring now to FIG. 2D, a cross-sectional illustration of a backside via with a sloped interface 226 is shown, in accordance with an additional embodiment. The embodiment shown in FIG. 2D may be substantially similar to the embodiment shown in FIG. 2C, with the exception of the interface 226. Instead of being angular corners, the corners of the backside via in FIG. 2D are rounded. The liner 225 may conform to the rounded interface 226.

Referring now to FIGS. 3A-3H, a series of cross-sectional illustrations depicting a process to form a backside via is shown, in accordance with an embodiment.

Figure 3A:
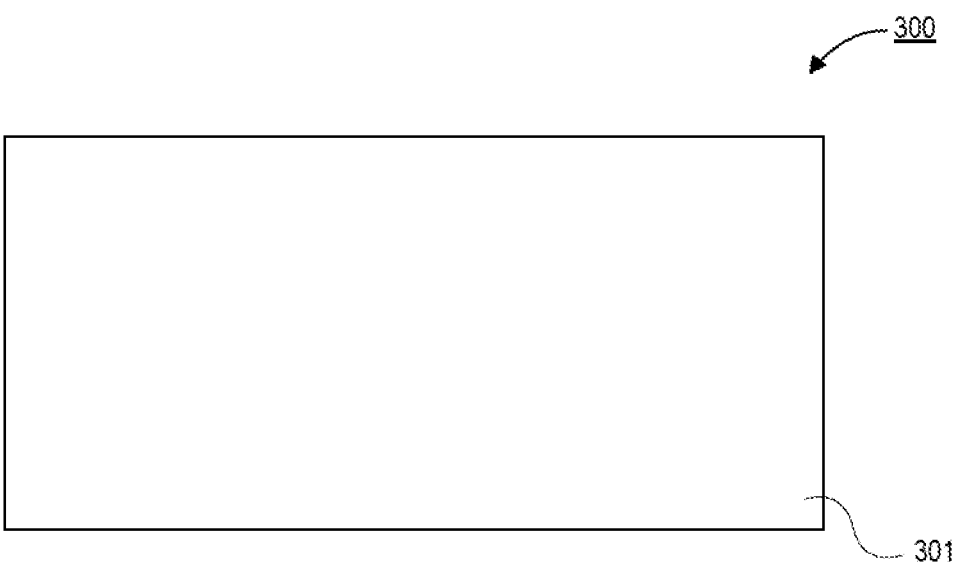
FIG. 3A is a cross-sectional illustration of a substrate, in accordance with an embodiment.

Referring now to FIG. 3A, a cross-sectional illustration of a semiconductor device 300 is shown, in accordance with an embodiment. The semiconductor device 300 may comprise a substrate 301. In an embodiment, the substrate 301 may be a semiconductor substrate, such as a silicon substrate or the like. In an embodiment a transistor device (not shown) may be provided on the substrate 301.

Figure 3B:
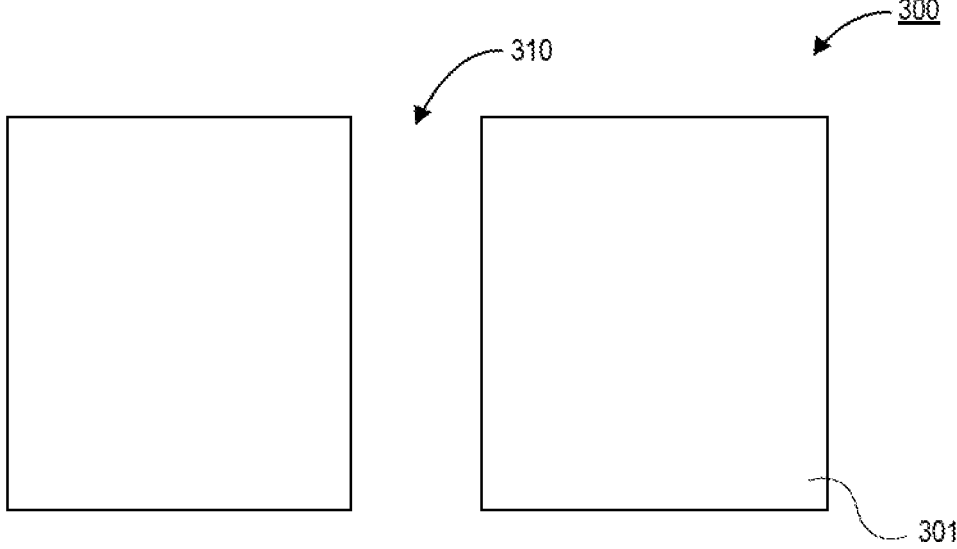
FIG. 3B is a cross-sectional illustration of the substrate after a backside via opening is formed through a thickness of the substrate, in accordance with an embodiment.

Referring now to FIG. 3B, a cross-sectional illustration of the semiconductor device 300 after an opening 310 is formed into the substrate 301 is shown, in accordance with an embodiment. In an embodiment, the opening 310 may be formed with an etching process. For example a dry etching process (e.g., plasma etching) may be used in order to form the opening 310. In an embodiment, the sidewalls of the opening 310 may be substantially vertical. In other embodiments, sidewalls of the opening 310 may be tapered or slightly tapered.

Figure 3C:
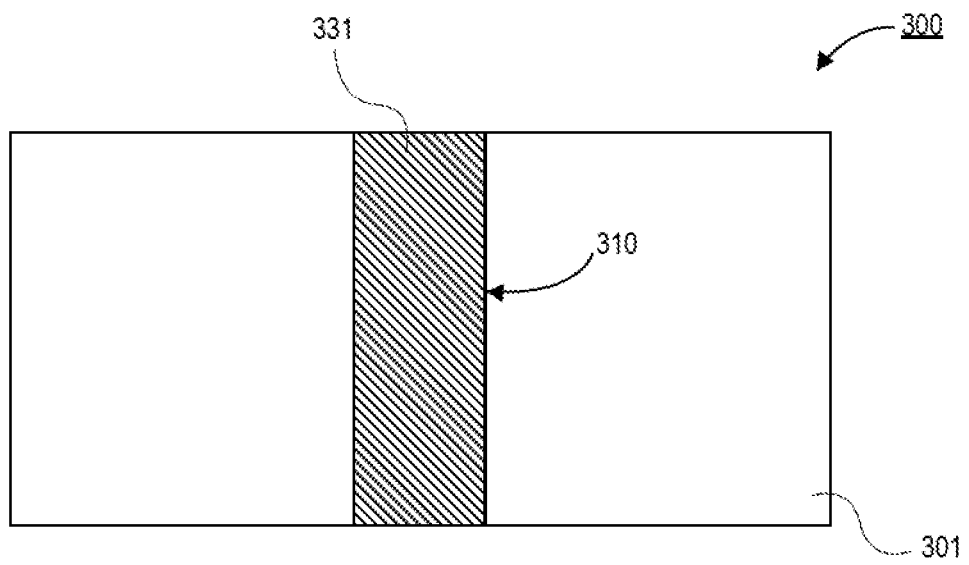
FIG. 3C is a cross-sectional illustration of the substrate after a sacrificial material is disposed into the opening, in accordance with an embodiment.

Referring now to FIG. 3C, a cross-sectional illustration of the semiconductor device 300 after a sacrificial material 331 is disposed into the opening 310 is shown, in accordance with an embodiment. In an embodiment, the sacrificial material 331 may be any material that is etch selective to the subsequently deposited liner. For example, when the liner is a nitride, the sacrificial material 331 may be an oxide. In an embodiment, the sacrificial material 331 may be deposited with any suitable deposition process, such as chemical vapor deposition, atomic layer deposition, or the like.

Figure 3D:
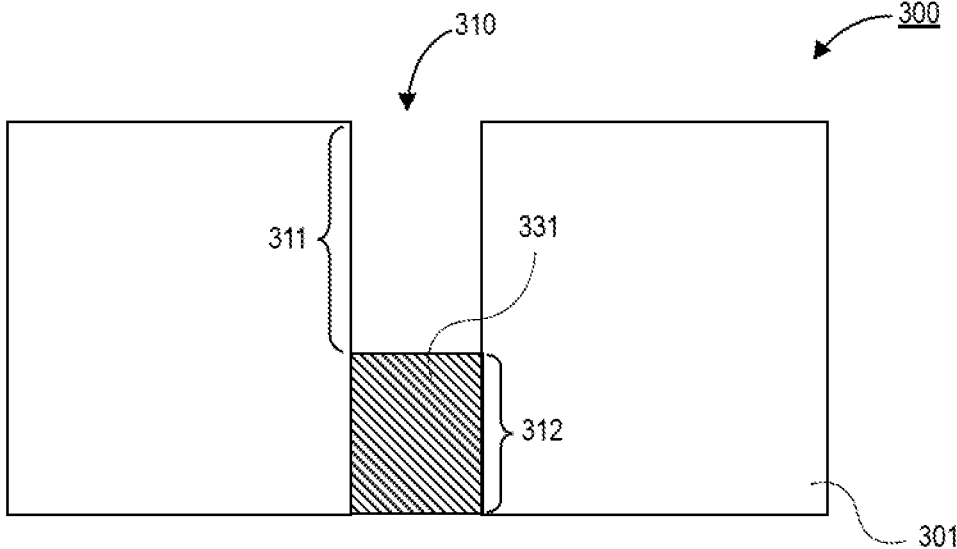
FIG. 3D is a cross-sectional illustration of the substrate after the sacrificial material is recessed, in accordance with an embodiment.

Referring now to FIG. 3D, a cross-sectional illustration of the semiconductor device 300 after the sacrificial material 331 is recessed is shown, in accordance with an embodiment. Recessing the sacrificial material 331 may define a first portion 311 and a second portion 312 of the opening 310. The first portion 311 may be above the sacrificial material 331 and the second portion 312 may be adjacent to the remaining sacrificial material 331. In an embodiment, the sacrificial material 331 may be recessed with an etching process.

Figure 3E:
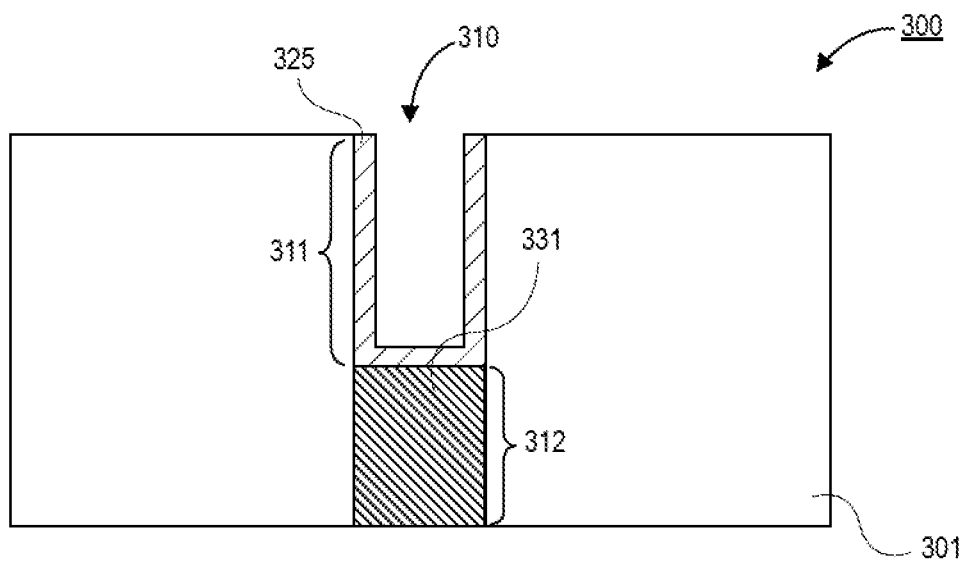
FIG. 3E is a cross-sectional illustration of the substrate after a liner is deposited into the opening, in accordance with an embodiment.

Referring now to FIG. 3E, a cross-sectional illustration of the semiconductor device 300 after a liner 325 is deposited in the opening 310 is shown, in accordance with an embodiment. In an embodiment, the liner 325 is conformally deposited over the sidewalls of the first portion 311. The liner 325 may also be deposited over the top surface of the sacrificial material 331. In an embodiment, the liner 325 is a material that is etch selective to the sacrificial material 331.

Figure 3F:
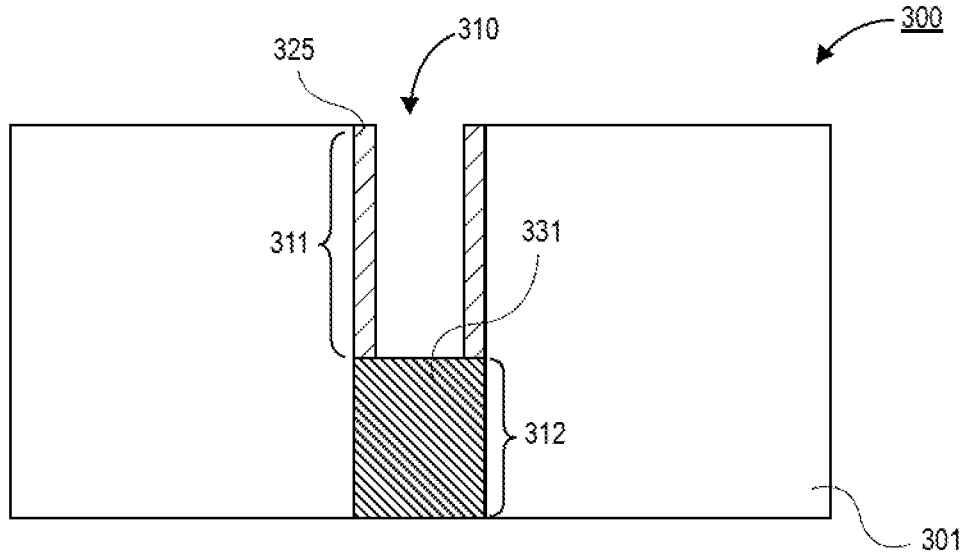
FIG. 3F is a cross-sectional illustration of the substrate after the bottom of the liner is removed to expose the sacrificial material, in accordance with an embodiment.

Referring now to FIG. 3F, a cross-sectional illustration of the semiconductor device 300 after the liner 325 is removed from over the sacrificial material 331 is shown, in accordance with an embodiment. In an embodiment, removal of the bottom portion of the liner 325 exposes a portion of the top surface of the sacrificial material 331. The bottom of the liner 325 may be removed with an etching process.

Figure 3G:
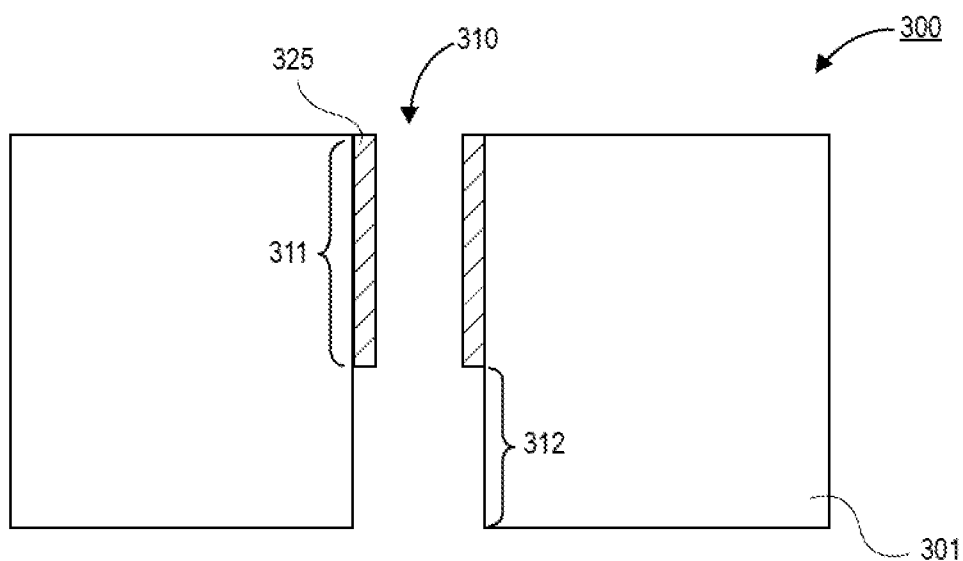
FIG. 3G is a cross-sectional illustration of the substrate after the sacrificial material is removed, in accordance with an embodiment.

Referring now to FIG. 3G, a cross-sectional illustration of the semiconductor device 300 after the sacrificial material 331 is removed is shown, in accordance with an embodiment. In an embodiment, the sacrificial material 331 is removed with an etching process or the like.

Figure 3H:
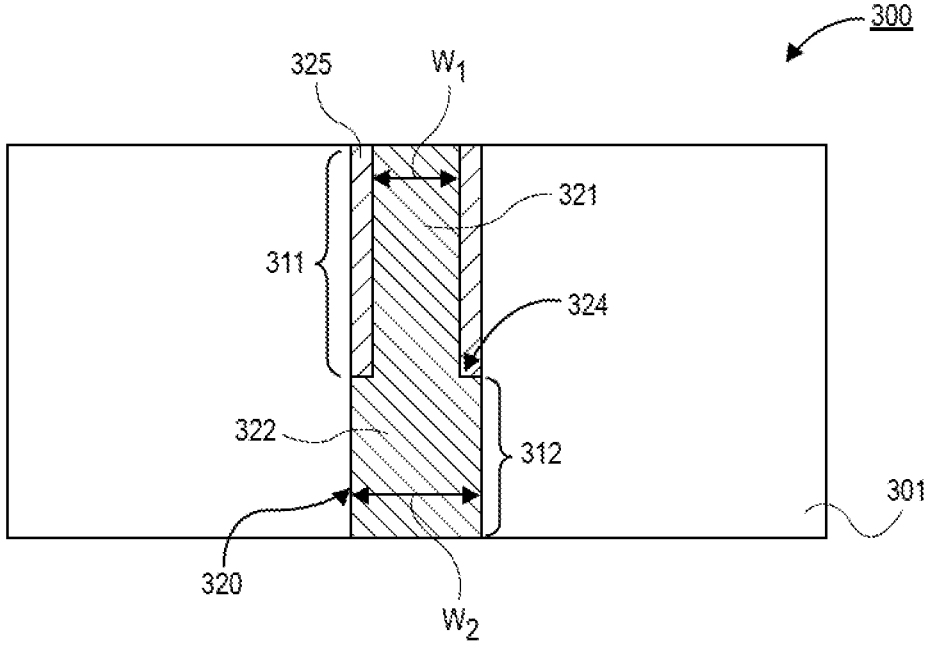
FIG. 3H is a cross-sectional illustration of the substrate after a via is deposited in the opening, in accordance with an embodiment.

Referring now to FIG. 3H, a cross-sectional illustration of the semiconductor device 300 after a backside via 320 is deposited in the opening 310 is shown, in accordance with an embodiment. In an embodiment, the backside via 320 comprises a first region 321 in the first portion 311 of the opening 310 and a second region 322 in the second portion 312 of the opening 310. The first region 321 may have a first width $W_1$, and the second region 322 may have a second width $W_2$ that is greater than the first width $W_1$. For example, the first width $W_1$ may be approximately ninety percent of the second width $W_2$ or less. In an embodiment, the interface 324 between the first region 321 and the second region 322 may be a stepped profile. In other embodiments, the interface 324 may be a sloped surface.

Figure 4A:
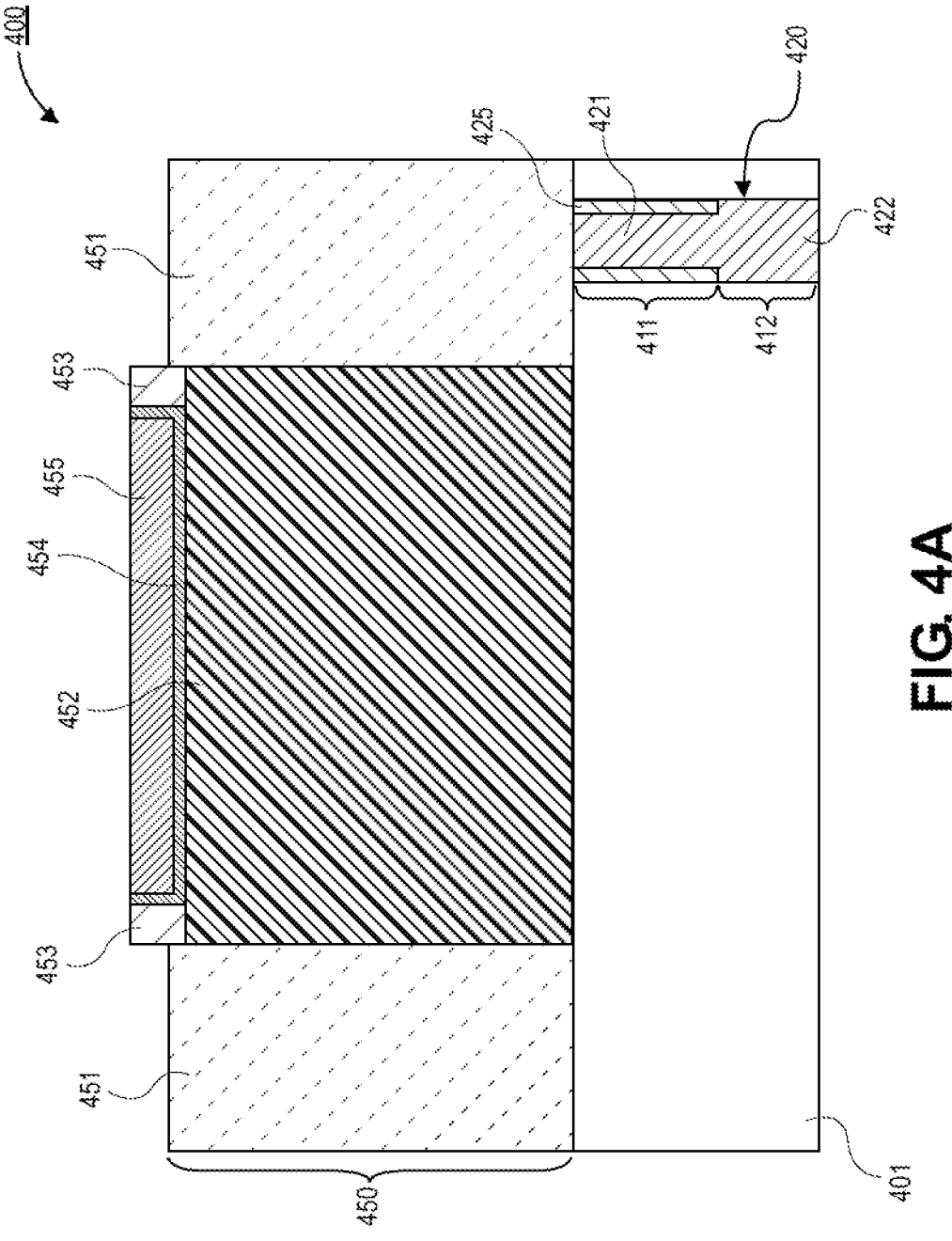
FIG. 4A is a cross-sectional illustration of a tri-gate transistor with a backside via to a source/drain region, in accordance with an embodiment.
Figure 4B:
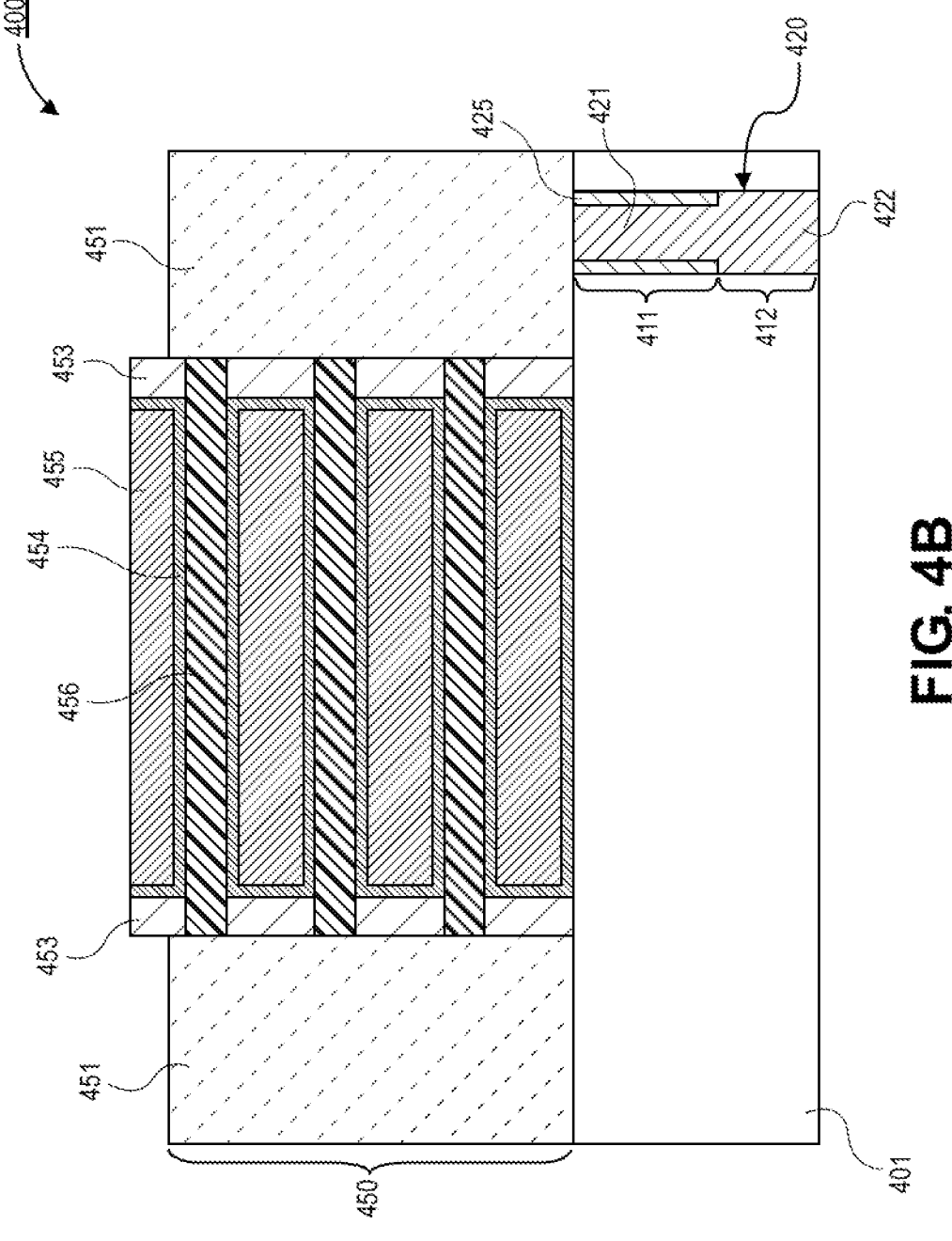
FIG. 4B is a cross-sectional illustration of a gate-all-around (GAA) transistor with a backside via to a source/drain region, in accordance with an embodiment.

Referring now to FIGS. 4A and 4B, cross-sectional illustrations of non-planar transistor devices that include backside vias are shown, in accordance with various embodiments. FIG. 4A illustrates a tri-gate transistor structure, and FIG. 5B illustrates a GAA transistor structure.

Referring now to FIG. 4A, a cross-sectional illustration of a semiconductor device 400 is shown, in accordance with an embodiment. In an embodiment, the semiconductor device 400 comprises a transistor 450 over a substrate 401, such as a silicon substrate or the like. In an embodiment, a semiconductor fin 452 extends between source/drain regions 451. A gate stack may be provided within spacers 453. The gate stack may include a gate dielectric and a gate electrode. While shown over the top surface of the fin 452 in FIG. 4A, it is to be appreciated that the gate stack wraps around sidewalls of the fin 452 into and out of the plane of FIG. 4A to provide tri-gate control of the fin 452. The gate stack may include a gate dielectric 454 and a gate metal 455.

The gate dielectric 454 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 454 to improve its quality when a high-k material is used.

In an embodiment, the gate metal 455 may include a workfunction metal and a fill metal. In an embodiment, when the workfunction metal will serve as an N-type workfunction metal, the workfunction metal preferably has a workfunction that is between about 3.9 eV and about 4.2 eV. N-type materials that may be used to form the workfunction metal include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal will serve as a P-type workfunction metal, the workfunction metal preferably has a workfunction that is between about 4.9 eV and about 5.2 eV. P-type materials that may be used to form the workfunction metal include, but are not limited to, ruthenium, palladium, platinum, cobalt, nickel, and conductive metal oxides, e.g., ruthenium oxide.

As shown, a backside via 420 is provided through the substrate 401 to contact a source/drain region 451. The backside via 420 may be substantially similar to any of the backside vias described in greater detail above. For example, a first portion 411 of the opening may include a liner 425 and a first region 421 of the backside via 420, and a second portion 412 of the opening may include a second region 422 of the backside via 420. As shown, the second region 422 may have a width that is greater than a width of the first region 421.

Referring now to FIG. 4B a cross-sectional illustration of a semiconductor device 400 is shown, in accordance with an additional embodiment. In an embodiment, the semiconductor device 400 comprises a transistor 450 over a substrate 401, such as a silicon substrate or the like. In an embodiment, a plurality of semiconductor nanowires 456 or nanoribbons, extend between source/drain regions 451. A gate stack may be provided around the nanowires 456 between spacers 453. In an embodiment, the gate stack may include a gate dielectric 454 and a gate electrode 455. The gate dielectric 454 and the gate electrode 455 may include materials similar to those described above with respect to FIG. 4A. In an embodiment, the gate stack wraps completely around a perimeter of the nanowires 456 (into and out of the plane of FIG. 4B) to provide GAA control of the nanowires 456.

As shown, a backside via 420 is provided through the substrate 401 to contact a source/drain region 451. The backside via 420 may be substantially similar to any of the backside vias described in greater detail above. For example, a first portion 411 of the opening may include a liner 425 and a first region 421 of the backside via 420, and a second portion 412 of the opening may include a second region 422 of the backside via 420. As shown, the second region 422 may have a width that is greater than a width of the first region 421.

Figure 5:
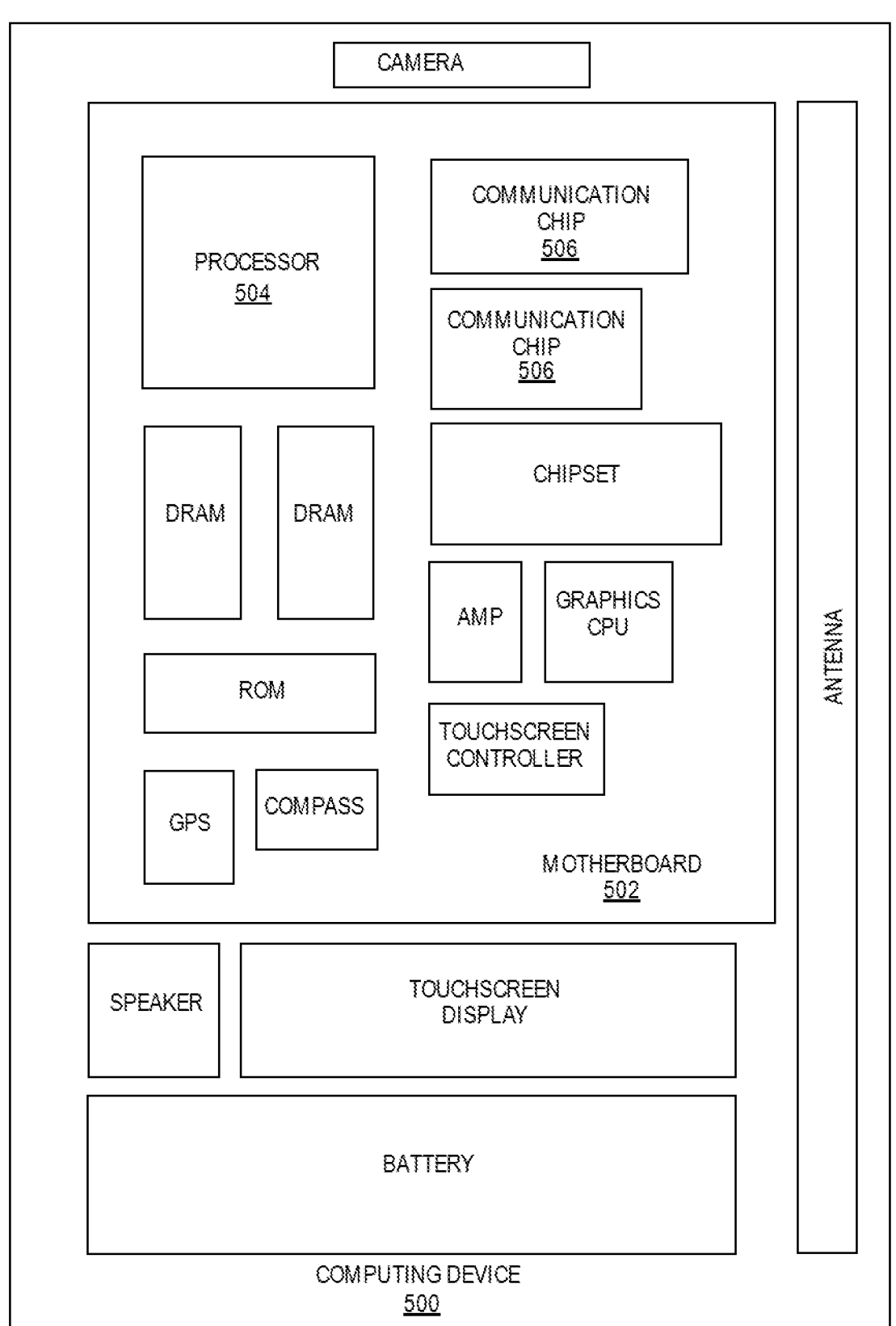
FIG. 5 illustrates a computing device in accordance with one implementation of an embodiment of the disclosure.

FIG. 5 illustrates a computing device 500 in accordance with one implementation of an embodiment of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In an embodiment, the integrated circuit die of the processor may comprise a transistor device with a backside via that has a first region with a first width and a second region with a second, wider, width, as described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In an embodiment, the integrated circuit die of the communication chip may comprise a transistor device with a backside via that has a first region with a first width and a second region with a second, wider, width, as described herein.

In further implementations, another component housed within the computing device 500 may comprise a transistor device with a backside via that has a first region with a first width and a second region with a second, wider, width, as described herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
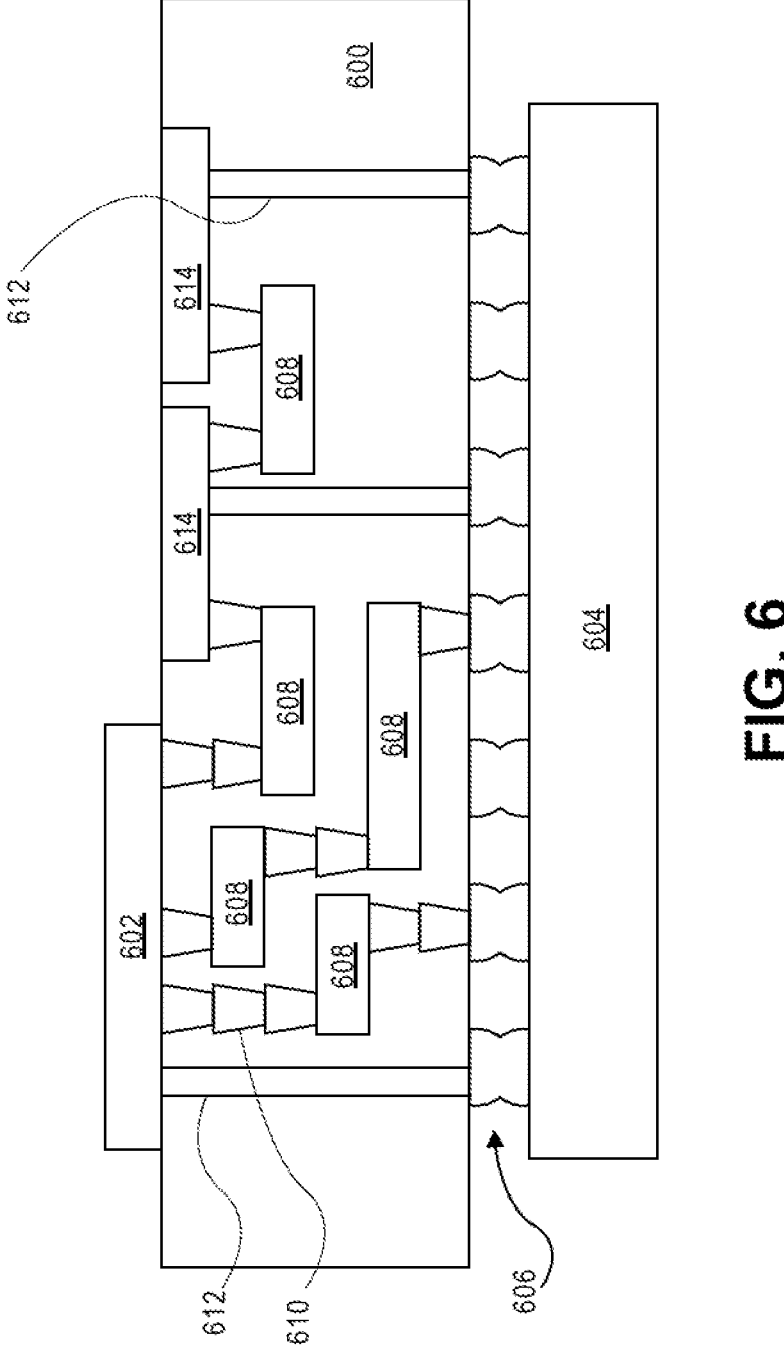
FIG. 6 is an interposer implementing one or more embodiments of the disclosure.

FIG. 6 illustrates an interposer 600 that includes one or more embodiments of the disclosure. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. In an embodiment, one of both of the first substrate 602 and the second substrate 604 may comprise a transistor device with a backside via that has a first region with a first width and a second region with a second, wider, width, in accordance with embodiments described herein. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the disclosure, apparatuses or processes disclosed herein may be used in the fabrication of interposer 600.

Thus, embodiments of the present disclosure may comprise a transistor device with a backside via that has a first region with a first width and a second region with a second, wider, width.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a via structure, comprising: a substrate; an opening through the substrate, wherein the opening has a first portion and a second portion under the first portion; a lining on sidewalls of the first portion of the opening; and a via filling the opening, wherein the via has a first region with a first width and a second region with a second width, wherein the first width is smaller than the second width.

Example 2: the via structure of Example 1, wherein the first width is approximately ninety percent of the second width or smaller.

Example 3: the via structure of Example 1 or Example 2, wherein the first region of the via is in the first portion of the opening, and wherein the second region of the via is in the second portion of the opening.

Example 4: the via structure of Examples 1-3, further comprising: a step at the junction between the first region of the via and the second region of the via.

Example 5: the via structure of Example 4, wherein the step is rounded.

Example 6: the via structure of Examples 1-5, wherein a junction between the first region of the via and the second region of the via is tapered.

Example 7: the via structure of Examples 1-6, wherein the second region has a non-uniform thickness through a length of the second region of the via.

Example 8: the via structure of Example 7, wherein an end of the second region of the via opposite from the first region of the via is rounded.

Example 9: the via structure of Examples 1-8, wherein the lining comprises oxygen or nitrogen.

Example 10: the via structure of Examples 1-9, wherein the via comprises tungsten.

Example 11: the via structure of Examples 1-10, wherein the first region of the via has a non-uniform thickness through a length of the first region of the via.

Example 12: the via structure of Examples 1-11, wherein the substrate comprises silicon.

Example 13: a method of forming a backside via, comprising: forming an opening in a substrate, wherein the opening has a first portion and a second portion below the first portion; filling the second portion of the opening with a sacrificial material; forming a lining along sidewalls of the opening in the first portion of the opening above the sacrificial material; removing the sacrificial material; and forming a via in the opening, wherein the via has a first width at the first portion of the opening adjacent to the lining and a second width at the second portion of the opening below the lining.

Example 14: the method of Example 13, wherein a stepped structure is provided at the junction between the first width and the second width.

Example 15: the method of Example 14, wherein the stepped structure is rounded.

Example 16: the method of Examples 13-15, wherein a junction between the first width and the second width is tapered.

Example 17: the method of Examples 13-16, wherein the first width is approximately ninety percent of the second width of smaller.

Example 18: the method of Examples 13-17, wherein the lining comprises oxygen or nitrogen.

Example 19: the method of Examples 13-18, wherein the via comprises tungsten.

Example 20: the method of Examples 13-19, wherein filling the second portion of the opening with a sacrificial material comprises: filling the first portion of the opening and the second portion of the opening with the sacrificial material; and recessing the sacrificial material to clear the first portion of the opening.

Example 21: a semiconductor device, comprising: a substrate; a non-planar transistor device with a source and a drain over the substrate; and a via through the substrate and coupled to one of the source and the drain, wherein the via comprises: a first region with a first width, wherein the first region contacts the one of the source and the drain; and a second region with a second width below the first region, wherein the second width is greater than the first width.

Example 22: the semiconductor device of Example 21, wherein a junction between the first region and the second region is a stepped interface.

Example 23: the semiconductor device of Example 21 or Example 22, further comprising: a lining adjacent to the first region of the via.

Example 24: an electronic system, comprising: a board; a package substrate coupled to the board; and a die coupled to the package substrate, wherein the die comprises: a substrate; a non-planar transistor device with a source and a drain over the substrate; and a via through the substrate and coupled to one of the source and the drain, wherein the via comprises: a first region with a first width, wherein the first region contacts the one of the source and the drain; and a second region with a second width below the first region, wherein the second width is greater than the first width.

Example 25: the electronic system of Example 24, wherein a junction between the first region and the second region is a stepped interface.

What is claimed is:

1. A via structure, comprising:
a substrate;
an opening through the substrate, wherein the opening has a first portion and a second portion under the first portion;
a lining on sidewalls of the first portion of the opening; and
a via filling the opening, wherein the via has a first region with a first width and a second region with a second width, wherein the first width is smaller than the second width,
wherein the via has an uppermost surface at a same level as an uppermost surface of the lining, wherein the second region has a non-uniform thickness through a length of the second region of the via, and wherein an end of the second region of the via opposite from the first region of the via is rounded.

2. The via structure of claim 1, wherein the first width is approximately ninety percent of the second width or smaller.

3. The via structure of claim 1, wherein the first region of the via is in the first portion of the opening, and wherein the second region of the via is in the second portion of the opening.

4. The via structure of claim 1, further comprising:

a step at the junction between the first region of the via and the second region of the via.

5. The via structure of claim 4, wherein the step is rounded.

6. The via structure of claim 1, wherein a junction between the first region of the via and the second region of the via is tapered.

7. The via structure of claim 1, wherein the lining comprises oxygen or nitrogen.

8. The via structure of claim 1, wherein the via comprises tungsten.

9. The via structure of claim 1, wherein the first region of the via has a non-uniform thickness through a length of the first region of the via.

10. The via structure of claim 1, wherein the substrate comprises silicon.

11. A method of forming a backside via, comprising:

forming an opening in a substrate, wherein the opening has a first portion and a second portion below the first portion;

filling the second portion of the opening with a sacrificial material;

forming a lining along sidewalls of the opening in the first portion of the opening above the sacrificial material;

removing the sacrificial material; and forming a via in the opening, wherein the via has a first width at the first portion of the opening adjacent to the lining and a second width at the second portion of the opening below the lining, and wherein the via has an uppermost surface at a same level as an uppermost surface of the lining.

12. The method of claim 11, wherein a stepped structure is provided at the junction between the first width and the second width.

13. The method of claim 12, wherein the stepped structure is rounded.

14. The method of claim 11, wherein a junction between the first width and the second width is tapered.

15. The method of claim 11, wherein the first width is approximately ninety percent of the second width or smaller.

16. The method of claim 11, wherein the lining comprises oxygen or nitrogen.

17. The method of claim 11, wherein the via comprises tungsten.

18. The method of claim 11, wherein filling the second portion of the opening with a sacrificial material comprises:

filling the first portion of the opening and the second portion of the opening with the sacrificial material; and recessing the sacrificial material to clear the first portion of the opening.

19. A semiconductor device, comprising:

a substrate;

a non-planar transistor device with a source and a drain over the substrate;

a via through the substrate and coupled to one of the source and the drain, wherein the via comprises:

a first region with a first width, wherein the first region contacts the one of the source and the drain; and a second region with a second width below the first region, wherein the second width is greater than the first width, wherein the second region has a non-uniform thickness through a length of the second region of the via, and wherein an end of the second region of the via opposite from the first region of the via is rounded; and a lining on sidewalls of the first region of the via, wherein the via has an uppermost surface at a same level as an uppermost surface of the lining.

20. The semiconductor device of claim 19, wherein a junction between the first region and the second region is a stepped interface.

21. The semiconductor device of claim 19, further comprising:

a lining adjacent to the first region of the via.

22. An electronic system, comprising:

a board;

a package substrate coupled to the board; and a die coupled to the package substrate, wherein the die comprises:

a substrate;

a non-planar transistor device with a source and a drain over the substrate;

a via through the substrate and coupled to one of the source and the drain, wherein the via comprises:

a first region with a first width, wherein the first region contacts the one of the source and the drain; and a second region with a second width below the first region, wherein the second width is greater than the first width, wherein the second region has a non-uniform thickness through a length of the second region of the via, and wherein an end of the second region of the via opposite from the first region of the via is rounded; and a lining on sidewalls of the first region of the via, wherein the via has an uppermost surface at a same level as an uppermost surface of the lining.

23. The electronic system of claim 22, wherein a junction between the first region and the second region is a stepped interface.

* * * * *